US009052369B2

(12) United States Patent
Kim et al.

(10) Patent No.: US 9,052,369 B2
(45) Date of Patent: Jun. 9, 2015

(54) METHOD AND APPARATUS FOR MEASURING A REMAINING CAPACITY OF A BATTERY WHEN CHARGING CONSTANT CURRENT/CONSTANT VOLTAGE MODE IN A PORTABLE TERMINAL

(75) Inventors: Jong-Woo Kim, Seoul (KR); Young-Gil Roh, Hwaseong-si (KR); Sung-Won Jeon, Suwon-si (KR)

(73) Assignee: SAMSUNG ELECTRONICS CO., LTD, Suwon-Si (KR)

( * ) Notice: Subject to any disclaimer, the term of this patent is extended or adjusted under 35 U.S.C. 154(b) by 255 days.

(21) Appl. No.: 13/618,487

(22) Filed: Sep. 14, 2012

(65) Prior Publication Data

US 2013/0106426 A1 May 2, 2013

(30) Foreign Application Priority Data

Oct. 28, 2011 (KR) .................. 10-2011-0111526

(51) Int. Cl.
*G01N 27/416* (2006.01)
*G01R 31/36* (2006.01)

(52) U.S. Cl.
CPC .................................. *G01R 31/362* (2013.01)

(58) Field of Classification Search
CPC ............ G01R 31/362; G01R 31/3662; G01R 31/3679; G01R 19/16542; G01R 31/3658; G01R 31/3693; G01R 31/3696
See application file for complete search history.

(56) References Cited

U.S. PATENT DOCUMENTS

| 5,703,486 | A | * | 12/1997 | Arai et al. ..................... 324/427 |
| 6,441,587 | B2 | | 8/2002 | Okada et al. |
| 6,621,250 | B1 | * | 9/2003 | Ohkubo et al. ............... 320/136 |
| 8,299,759 | B2 | | 10/2012 | Okamura |
| 2001/0054879 | A1 | | 12/2001 | Okada et al. |
| 2010/0017155 | A1 | | 1/2010 | Nareid |
| 2010/0201323 | A1 | | 8/2010 | Okamura |

FOREIGN PATENT DOCUMENTS

| JP | 2007-1935367 | 8/2007 |
| KR | 10-2004-0055207 | 6/2004 |

* cited by examiner

*Primary Examiner* — Tung X Nguyen

(57) ABSTRACT

According to one embodiment, a method for measuring the remaining capacity of a battery in a portable terminal includes calculating an elapsed time when a voltage of the battery, which increases while the battery is being charged, arrives at a fully charged voltage, and providing a remaining capacity of the battery, which corresponds to a ratio of the calculated elapsed time to a threshold time.

20 Claims, 4 Drawing Sheets

METHOD AND APPARATUS FOR MEASURING A REMAINING CAPACITY OF A BATTERY WHEN CHARGING CONSTANT CURRENT/CONSTANT VOLTAGE MODE IN A PORTABLE TERMINAL

CROSS-REFERENCE TO RELATED APPLICATION(S) AND CLAIM OF PRIORITY

The present application is related to and claims the benefit under 35 U.S.C. §119(a) of a Korean patent application filed in the Korean Intellectual Property Office on Oct. 28, 2011 and assigned Serial No. 10-2011-0111526, the entire disclosure of which is hereby incorporated by reference.

TECHNICAL FIELD OF THE INVENTION

The present invention generally relates to battery charging devices, and more particularly, to a method and apparatus for measuring the remaining capacity of a battery in a portable terminal.

BACKGROUND OF THE INVENTION

Portable terminals such as mobile terminals (i.e., cellular phones), electronic schedulers, and personal complex terminals have become an important aspect of current society. In essence, these portable terminals have developed into important means of information transmission.

Almost all portable terminals use a battery as a power source. The battery is typically charged using a charger that is connected to the portable terminal.

The portable terminal may include certain components for measuring the remaining capacity of the battery and may monitor the remaining capacity information of the battery while the battery is being charged. Recently, portable terminals have been miniaturized by integrating discrete components, thus reducing the number of components. Also, the components for measuring the remaining capacity of the battery have also been miniaturized.

A portable terminal which does not include components for measuring the remaining capacity of the battery may monitor the remaining capacity of the battery by measuring a voltage of the battery while the battery is charged and loading the remaining capacity of the battery, which corresponds to the measured voltage. In general, the charger performs a Constant Current (CC) charging mode and a Constant Voltage (CV) charging mode when charging the battery.

FIG. 1 is a graph illustrating voltage of a battery and the remaining capacity of the battery based on a charging curve of the battery.

Referring to FIG. 1, while a battery charge is in progress for a CC charging mode of charging the battery with a CC (500 mA), a voltage of the battery increases. If the voltage of the battery arrives at a fully charged voltage of 4.2 volts (V), the charger changes to a CV charging mode of charging the battery with a constant voltage of 4.2V. When a charging current to the battery reduces to a sufficiently small amount of current while the CV charging mode is performed, the charging of the battery is completed.

As described above, although the battery may have a full charged voltage while being charged in the CC mode, it should also be charged using the CV charging mode to be fully charged. However, when the voltage of the battery arrives at a full charged voltage while the battery is charged, a conventional portable terminal may display the remaining capacity of the battery as being fully charged. Thus, a problem may exist where the conventional portable terminal does not provide the accurate remaining capacity of the battery.

SUMMARY OF THE INVENTION

To address the above-discussed deficiencies of the prior art, it is a primary object to provide at least the advantages described below. Accordingly, an aspect of the present invention is to provide a method and apparatus for measuring a remaining capacity of a battery without any special discrete components for measuring the remaining capacity of the battery.

Another aspect of the present invention is to provide a method and apparatus for loading the reference remaining capacity of a battery when a voltage of the battery, which increases while charging a battery using a constant current (CC) mode and a constant voltage (CV) mode, arrives at a fully charged voltage from a database, calculating an adding value according to a ratio of an elapsed time to a threshold time, adding the calculated adding value to the reference remaining capacity of the battery, and providing the added remaining capacity of the battery.

Another aspect of the present invention is to provide a method and apparatus for reducing cost by providing the remaining capacity of a battery without including any special discrete components for measuring the remaining capacity of the battery.

In accordance with an aspect of the present invention, a method of measuring the remaining capacity of a battery while charging a CC/CV mode of the battery in a portable terminal includes calculating an elapsed time from a time point when voltage of the battery, which increases while the battery is being charged, arrives at a fully charged voltage and providing remaining capacity of the battery, which corresponds to a ratio of the calculated elapsed time to a threshold time.

In accordance with another aspect of the present invention, an apparatus for measuring the remaining capacity of a battery while charging a CC/CV mode of the battery in a portable terminal includes a storage unit configured to store a variety of data items when a controller performs a control operation and a display unit configured to output remaining capacity of the battery under control of the controller, wherein the controller is configured to calculate an elapsed time when voltage of the battery, which increases while the battery is being charged, arrives at a fully charged voltage and control the display unit to output a remaining capacity of the battery, which corresponds to a ratio of the calculated elapsed time to a threshold time loaded from the storing unit to the display unit.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF THE INVENTION

Figure 1:
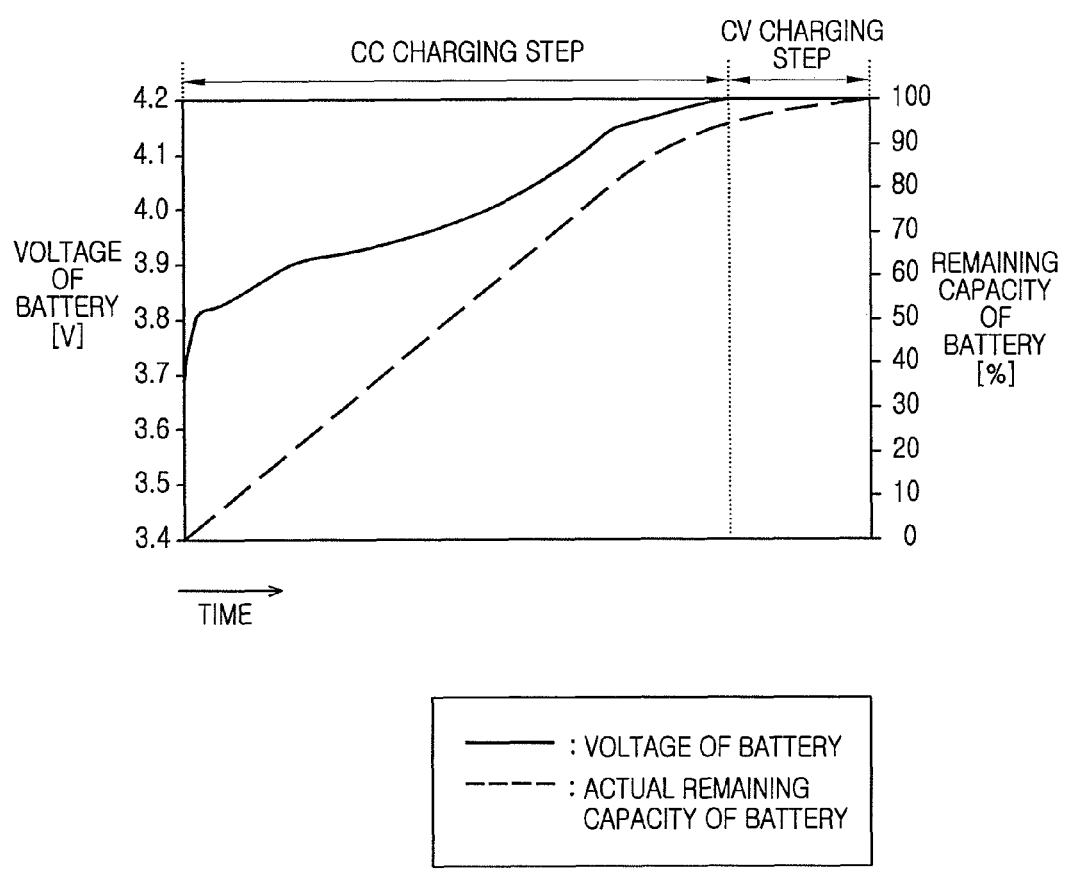
FIG. 1 is a graph illustrating voltage of a battery and the remaining capacity of the battery based on charging the battery.
Figure 2:
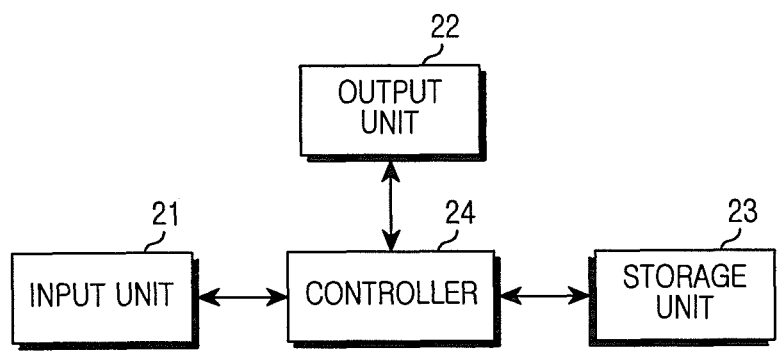
FIG. 2 illustrates an example configuration of a portable terminal according to one embodiment of the present invention.
Figure 3:
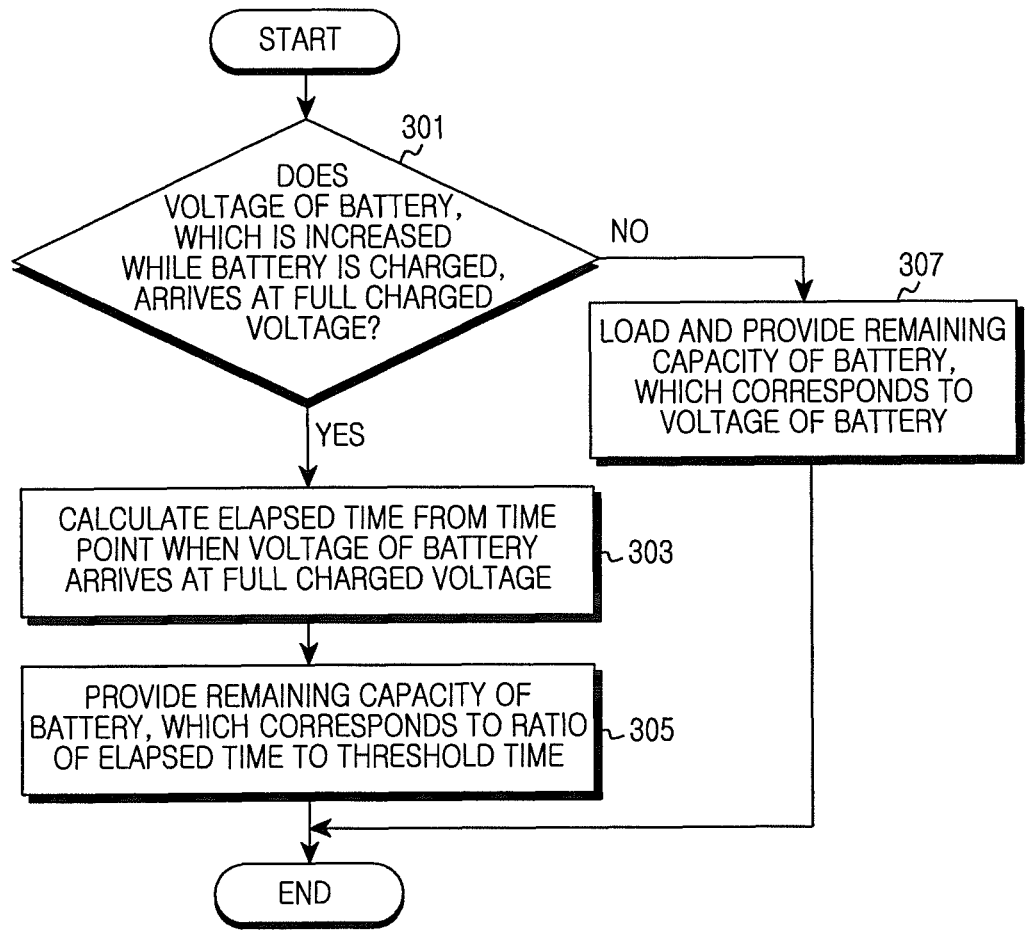
FIG. 3 illustrates an example process of measuring the remaining capacity of a battery while the battery is being charged according to one embodiment of the present invention.
Figure 4:
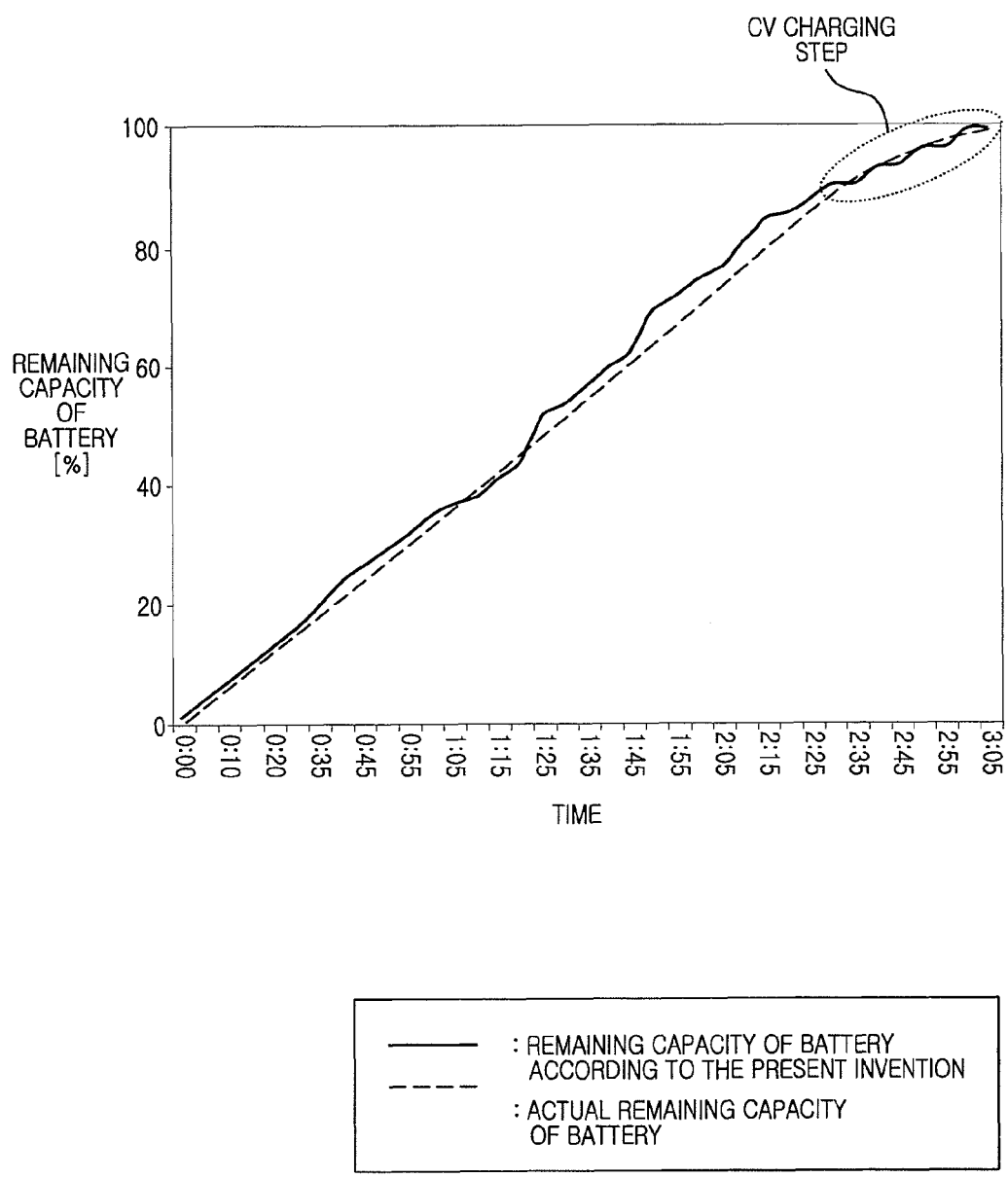
FIG. 4 is a graph illustrating the remaining capacity of a battery while the battery is charged according to one embodiment of the present invention.

FIGS. 2 through 4, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged battery charging systems. Exemplary embodiments of the present invention will be described herein below with reference to the accompanying drawings. In the following description, well-known functions or constructions are not described in detail since they would obscure the invention in unnecessary detail. Also, the terms used herein are defined according to the functions of the present invention. Thus, the terms may vary depending on user's or operator's intension and usage. That is, the terms used herein must be understood based on the descriptions made herein.

The present invention described hereinafter relates to a method and apparatus for measuring the more accurate remaining capacity of a battery without components for measuring the remaining capacity of the battery. In accordance with one embodiment of the present invention, the prevent invention relates to a method and apparatus for loading the reference remaining capacity of a battery in the time point when voltage of the battery, which is being increased while charging a CC/CV of the battery, arrives at a full charged voltage from a database, calculating an adding value according to a ratio of an elapsed time to a threshold time, adding the calculated adding value to the reference remaining capacity of the battery, and providing the added remaining capacity of the battery.

FIG. 2 illustrates an example configuration of a portable terminal according to one embodiment of the present invention.

Referring to FIG. 2, the portable terminal includes an input unit 21, an output unit 22, a storage unit 23, and a controller 24.

The input unit 21 outputs an input signal to the controller 24.

The output unit 22 receives an output signal under control of the controller 24 and outputs the received output signal as a voice and an image. For example, the output unit 22 expresses the remaining capacity of a battery under control of the controller 24.

The portable terminal may include a touch screen in which the input unit 21 and the output unit 22 are integrated.

The storage unit 23 stores executable programs for controlling an overall operation of the portable terminal and a variety of data item input and output when a control operation of the portable terminal is performed.

The controller 24 controls an overall operation of the portable terminal.

Hereinafter, a method of measuring the remaining capacity of a battery while the battery is charged in the controller 24 according to one embodiment of the present invention will be described in detail.

FIG. 3 illustrates an example process of measuring the remaining capacity of a battery while the battery is being charged according to one embodiment of the present invention.

Referring to FIG. 2 and FIG. 3, the controller 24 verifies whether the voltage of a battery, which increases while the battery is being charged, arrives at a full charged voltage in step 301.

Before the voltage of the battery arrives at the fully charged voltage, the controller 24 proceeds to step 307, loads the remaining capacity of the battery, which corresponds to voltage of the battery, from a database, and provides the loaded remaining capacity of the battery. As described above, the battery is charged in the order of a CC charging mode and a CV charging mode. The battery is charged through the CC charging mode while the voltage of the battery increases. When the voltage of the battery, which increases through the CC charging mode, arrives at the fully charged voltage, the battery is then charged through the CV charging mode. Because the CC charging mode and the CV charging mode are performed by a charger, it is unnecessary for the controller 24 to identify the CC charging mode and the CV charging mode. Herein, when the voltage of the battery, which increases while the battery is being charged, arrives at the fully charged voltage, the controller 24 may know that the CV charging mode will be performed. The controller 24 provides the remaining capacity of the battery, which corresponds to the voltage of the battery, which increased through the CC charging mode, with reference to a database. The conventional portable terminal provided the remaining capacity of the battery as fully charged (e.g., 100%) when the voltage of the battery, which increases through the CC charging mode, arrives at the fully charged voltage. However, the portable terminal according to one embodiment of the present invention provides the remaining capacity of the battery as a percent value which is below 100%, for example, 90%. The actual remaining capacity (hereinafter, referred to as the reference remaining capacity) of the battery in the time point when the voltage of the battery, which increases while the battery is being charged, arrives at the fully charged voltage is experimentally determined, and the determined values are stored in a database.

The battery is fully charged after it passes through the CV charging mode during a threshold time or more. The threshold time indicates time when a charging current to the battery is reduced and arrives at a small amount of current. That is, when the CV charging mode continues during the threshold time or more, the battery has the actual remaining capacity of 100% of the battery capacity. The threshold time is experimentally determined and the determined values are stored in the database.

When the voltage of the battery, which increases while the battery is being charged, arrives at the fully charged voltage, the controller 24 proceeds to step 303 and calculates an elapsed time from the time point when the voltage of the battery arrives at the fully charged voltage.

The controller 24 proceeds to the step 305 and provides the remaining capacity of the battery, which corresponds to a ratio of the calculated elapsed time to the threshold time. The controller 24 loads the reference remaining capacity of the battery at the time point when the voltage of the battery, which increases while the battery is being charged, arrives at the fully charged voltage from the database. In addition, the controller 24 calculates an adding value according to the ratio of the calculated elapsed time to the threshold time, adds the calculated adding value to the reference remaining capacity of the battery, and provides the added remaining capacity of the battery. For example, if the voltage of the battery, which increases while the battery is being charged, arrives at the fully charged voltage, the controller 24 provides the reference remaining capacity of 90% of the battery. If an elapsed time of 10 minutes is calculated for a threshold time of 20 minutes, the controller 24 provides the remaining capacity of 95% of the battery. If an elapsed time of 20 minutes is calculated, the controller 24 provides the remaining capacity of 100% of the battery.

In addition, when the calculated elapsed time exceeds the threshold time in step 305, the controller 24 provides the remaining capacity of 100% of the battery.

FIG. 4 illustrates an example graph illustrating the remaining capacity of a battery while the battery is charged according to one embodiment of the present invention.

Referring to FIG. 4, it is shown that the remaining capacity of the battery, which is provided while the battery is being charged, corresponds to the actual remaining capacity of the battery in a CV charging mode.

In conclusion, a method and apparatus for measuring the remaining capacity of a battery according to one embodiment of the present invention may provide the accurate remaining capacity of a battery while the battery is charged without special components for measuring the remaining capacity of the battery.

Alternate embodiments of the present invention can also comprise computer readable codes on a computer readable medium. The computer readable medium includes any data storage device that can store data that can be read by a computer system. Examples of a computer readable medium include magnetic storage media (such as ROM, floppy disks, and hard disks, among others), optical recording media (such as CD-ROMs or DVDs), and storage mechanisms such as carrier waves (such as transmission through the Internet). The computer readable medium can also be distributed over network coupled computer systems so that the computer readable code is stored and executed in a distributed fashion. Also, functional programs, codes, and code segments for accomplishing the present invention can be construed by programmers of ordinary skill in the art to which the present invention pertains.

It will be appreciated that embodiments of the present invention according to the claims and description in the specification can be realized in the form of hardware, software or a combination of hardware and software.

Any such software may be stored in a computer readable storage medium. The computer readable storage medium stores one or more programs (software modules), the one or more programs comprising instructions, which when executed by one or more processors in an electronic device, cause the electronic device to perform a method of the present invention.

Any such software may be stored in the form of volatile or non-volatile storage such as, for example, a storage device like a ROM, whether erasable or rewritable or not, or in the form of memory such as, for example, RAM, memory chips, device or integrated circuits or on an optically or magnetically readable medium such as, for example, a CD, DVD, magnetic disk or magnetic tape or the like. It will be appreciated that the storage devices and storage media are embodiments of machine-readable storage that are suitable for storing a program or programs comprising instructions that, when executed, implement embodiments of the present invention.

Accordingly, embodiments provide a program comprising code for implementing apparatus or a method as claimed in any one of the claims of this specification and a machine-readable storage storing such a program.

While the present invention has been particularly shown and described with reference to exemplary embodiments thereof, it will be understood by those skilled in the art that various changes in form and details may be made therein without departing from the spirit and scope of the present invention as defined by the appended claims.

What is claimed is:

1. A method of measuring a remaining capacity of a battery while the battery is being charged with at least one of a constant current mode and a constant voltage mode, the method comprising:
    calculating an elapsed time from when a voltage of the battery, which increases while the battery is being charged, arrives at a fully charged voltage; and
    providing a remaining capacity of the battery, which corresponds to a ratio of the calculated elapsed time to a threshold time.

2. The method of claim 1, wherein providing the remaining capacity of the battery, which corresponds to the ratio of the calculated elapsed time to the threshold time comprises:
    loading reference battery capacity of the battery when the voltage of the battery, which increases while the battery is being charged, arrives at the fully charged voltage from a database; and
    calculating an adding value according to the ratio of the calculated elapsed time to the threshold time, adding the calculated adding value to the reference remaining capacity of the battery, and providing the added remaining capacity of the battery.

3. The method of claim 2, wherein providing the remaining capacity of the battery, which corresponds to the ratio of the calculated elapsed time to the threshold time, comprises providing a remaining capacity of the battery when the calculated elapsed time arrives at the threshold time.

4. The method of claim 1, wherein providing the remaining capacity of the battery, which corresponds to the ratio of the calculated elapsed time to the threshold time, comprises providing a remaining capacity of the battery when the calculated elapsed time exceeds the threshold time.

5. The method of claim 1, further comprising loading a remaining capacity of the battery, which corresponds to the voltage of the battery, before the voltage of the battery, which increases while the battery is being charged, arrives at the fully charged voltage from a database and providing the loaded remaining capacity of the battery.

6. The method of claim 2, wherein the reference remaining capacity of the battery is less than 100 percent (%).

7. An apparatus configured to measure a remaining capacity of a battery while the battery is being charged with at least one of a constant current (CC) mode and a constant voltage (CV) mode, the apparatus comprising:
a storage unit configured to store a variety of data items when a controller performs a control operation; and
a display unit configured to output a remaining capacity of the battery under control of the controller, wherein the controller is configured to calculate an elapsed time from a time point when the voltage of the battery, which increases while the battery is being charged, arrives at a fully charged voltage and control the display unit to output remaining capacity of the battery, which corresponds to a ratio of the calculated elapsed time to a threshold time loaded from the storing unit to the display unit.

8. The apparatus of claim 7, wherein the controller is configured to load a reference battery capacity of the battery when the voltage of the battery, which increases while the battery is being charged, arrives at the full charged voltage from the storage unit, calculate an adding value according to the ratio of the elapsed time to the threshold time, add the calculated adding value to the reference remaining capacity of the battery, and control the display unit to output the added remaining capacity of the battery to the display unit.

9. The apparatus of claim 8, wherein the controller is configured to control the display unit to output a remaining capacity of the battery when the calculated elapsed time arrives at the threshold dine.

10. The apparatus of claim 7, wherein the controller is configured to control the display unit to output remaining capacity of the battery when the calculated elapsed time exceeds the threshold time.

11. The apparatus of claim 7, wherein the controller is configured to load the remaining capacity of the battery, which corresponds to voltage of the battery, before the voltage of the battery, which increases while the battery is being charged, arrives at the full charged voltage from the storage unit and control the display unit to output the loaded remaining capacity of the battery to the display unit.

12. The apparatus of claim 8, wherein the reference remaining capacity of the battery is less than 100 percent (%).

13. A portable terminal comprising:
a measuring unit configured to measure a remaining capacity of a battery while the battery is being charged with at least one of a constant current (CC) mode and a constant voltage (CV) mode;
a storage unit configured to store a variety of data items when a controller performs a control operation; and
a display unit configured to output a remaining capacity of the battery under control of the controller, wherein the controller is configured to calculate an elapsed time from a time point when the voltage of the battery, which increases while the battery is being charged, arrives at a fully charged voltage and control the display unit to output remaining capacity of the battery, which corresponds to a ratio of the calculated elapsed time to a threshold time loaded from the storing unit to the display unit.

14. The apparatus of claim 13, wherein the controller is configured to load a reference battery capacity of the battery when the voltage of the battery, which increases while the battery is being charged, arrives at the full charged voltage from the storage unit, calculate an adding value according to the ratio of the elapsed time to the threshold time, add the calculated adding value to the reference remaining capacity of the battery, and control the display unit to output the added remaining capacity of the battery to the display unit.

15. The apparatus of claim 14, wherein the controller is configured to control the display unit to output a remaining capacity of the battery when the calculated elapsed time arrives at the threshold time.

16. The apparatus of claim 13, wherein the controller is configured to control the display unit to output remaining capacity of the battery when the calculated elapsed time exceeds the threshold time.

17. The apparatus of claim 13, wherein the controller is configured to load the remaining capacity of the battery, which corresponds to voltage of the battery, before the voltage of the battery, which increases while the battery is being charged, arrives at the full charged voltage from the storage unit and control the display unit to output the loaded remaining capacity of the battery to the display unit.

18. The apparatus of claim 14, wherein the reference remaining capacity of the battery is less than 100 percent (%).

19. The portable terminal of claim 13, wherein the portable terminal comprises a cellular telephone.

20. The portable terminal of claim 13, wherein the portable terminal further comprises a charging circuit configured to provide the CC mode and the CV mode.

* * * * *